（12）United States Patent
Jen et al.

(10) Patent No.: US 10,373,966 B2
(45) Date of Patent: Aug. 6, 2019

(54) MASK ROM AND PROCESS FOR FABRICATING THE SAME

(71) Applicant: United Microelectronics Corp., Hsinchu (TW)

(72) Inventors: Po-Han Jen, Hsinchu (TW); Chieh-Yu Tsai, Taipei (TW); Chun-Cheng Chiang, Yilan County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/264,423

(22) Filed: Sep. 13, 2016

(65) Prior Publication Data

US 2018/0076207 A1    Mar. 15, 2018

(51) Int. Cl.
*H01L 27/112* (2006.01)
*H01L 49/02* (2006.01)
*H01L 21/28* (2006.01)

(52) U.S. Cl.
CPC .. *H01L 27/11253* (2013.01); *H01L 21/28035* (2013.01); *H01L 28/20* (2013.01)

(58) Field of Classification Search
CPC ............. H01L 27/115; H01L 27/11521; H01L 27/11524; H01L 27/1126; H01L 27/1203
See application file for complete search history.

(56) References Cited

U.S. PATENT DOCUMENTS

| 2005/0162933 | A1* | 7/2005 | Madurawe | H03K 19/17704 365/189.05 |
| 2007/0194369 | A1* | 8/2007 | Koh | H01L 27/115 257/315 |
| 2018/0061888 | A1* | 3/2018 | Kwon | H01L 27/2409 |

* cited by examiner

*Primary Examiner* — Tony Tran
(74) *Attorney, Agent, or Firm* — J.C. Patent

(57) ABSTRACT

A Mask ROM is shown, including first resistors as a first part of memory cells, second resistors as a second part of memory cells, and contact plugs. Each first resistor includes: an undoped first poly-Si layer including an upper horizontal bar, a lower horizontal bar contiguous with the upper horizontal bar, and a step structure with a step height at which the two bars are contiguous, a spacer on the sidewall of the step structure, and a first silicide layer on the first poly-Si layer and being divided apart by the spacer. Each second resistor includes an undoped second poly-Si layer, and a contiguous second silicide layer on the second poly-Si layer. The contact plugs are disposed on the first silicide layer on the upper horizontal bar of each first poly-Si layer, and on the second silicide layer.

11 Claims, 3 Drawing Sheets

MASK ROM AND PROCESS FOR FABRICATING THE SAME

BACKGROUND OF THE INVENTION

Field of Invention

This invention relates to a semiconductor apparatus, and particularly relates to a structure of a Mask ROM (read-only memory) and a process for fabricating the same.

Description of Related Art

A conventional Mask ROM includes MOS transistors as memory cells, where bit-line contact plugs are formed on source/drain (S/D) regions of the MOS transistors. However, current leakage easily occurs if a contact plug is misaligned, and the memory cell constituted of a MOS transistor occupies a large lateral area.

SUMMARY OF THE INVENTION

Accordingly, this invention provides a Mask ROM in which resistors instead of MOS transistors serve as memory cells.

This invention also provides a process for fabricating the Mask ROM.

The Mask ROM of this invention is shown, including first resistors as a first part of memory cells, second resistors as a second part of memory cells, and contact plugs. Each first resistor includes: an undoped first poly-Si layer including an upper horizontal bar and a step structure with a step height adjacent to the upper horizontal bar, a spacer on the sidewall of the step structure, and a first silicide layer on the first poly-Si layer and being divided apart by the spacer. Each second resistor includes an undoped second poly-Si layer, and a contiguous second silicide layer on the second poly-Si layer. The contact plugs are disposed on the first silicide layer on the upper horizontal bar of each first poly-Si layer, and on the second silicide layer.

In an embodiment of the Mask ROM of this invention, each first resistor further includes a material layer that is under the upper horizontal bar of the first poly-Si layer and causes the step height. The material layer may include an insulating layer.

The process for fabricating the Mask ROM of this invention includes the steps below. A plurality of undoped first poly-Si layers and a plurality of undoped second poly-Si layers are formed, wherein each first poly-Si layer includes an upper horizontal bar and a step structure with a step height adjacent to the upper horizontal bar. A spacer is formed on the sidewall of the step structure of each first poly-Si layer. A salicide (self-aligned silicide) process is performed to form a first silicide layer on each first poly-Si layer and a second silicide layer on each second poly-Si layer, wherein the first silicide layer is divided apart by the spacer to be non-contiguous on the first poly-Si layer, and the second silicide layer is contiguous on the second poly-Si layer. A plurality of contact plugs are formed on the first silicide layers on the upper horizontal bars of the first poly-Si layers, and on the second silicide layers.

In an embodiment, the process of this invention further includes: forming, before the first and the second poly-Si layers are formed, a patterned material layer for causing the step height. After the first and the second poly-Si layers are formed, the upper horizontal bar of each first poly-Si layers is located on the patterned material layer.

Since resistors are utilized as memory cells and the bit-line contact plugs are formed on the resistors in the Mask ROM of this invention, current leakage can be prevented even if a contact plug is misaligned. Moreover, the lateral area occupied by a resistor is remarkably smaller than the lateral area occupied by a MOS transistor in a conventional Mask ROM.

In order to make the aforementioned and other objects, features and advantages of the present invention comprehensible, a preferred embodiment accompanied with figures is described in detail below.

BRIEF DESCRIPTION OF THE DRAWINGS

FIG. 2-1 illustrates an alternative for the structure of the substrate of the Mask ROM according to an embodiment of this invention.

DESCRIPTION OF EMBODIMENTS

This invention will be further explained with the following embodiments and the accompanying drawings, which are however not intended to restrict the scope of this invention. For example, though in the embodiments the poly-Si part of the word lines are formed simultaneously with the poly-Si layers of the resistor memory cells and the silicide part of the word lines are faulted simultaneously with the silicide layers of the resistor memory cells, in other embodiments, word lines may alternatively be formed over the silicide layers of the resistor memory cells after the silicide layers are formed.

Figure 3:
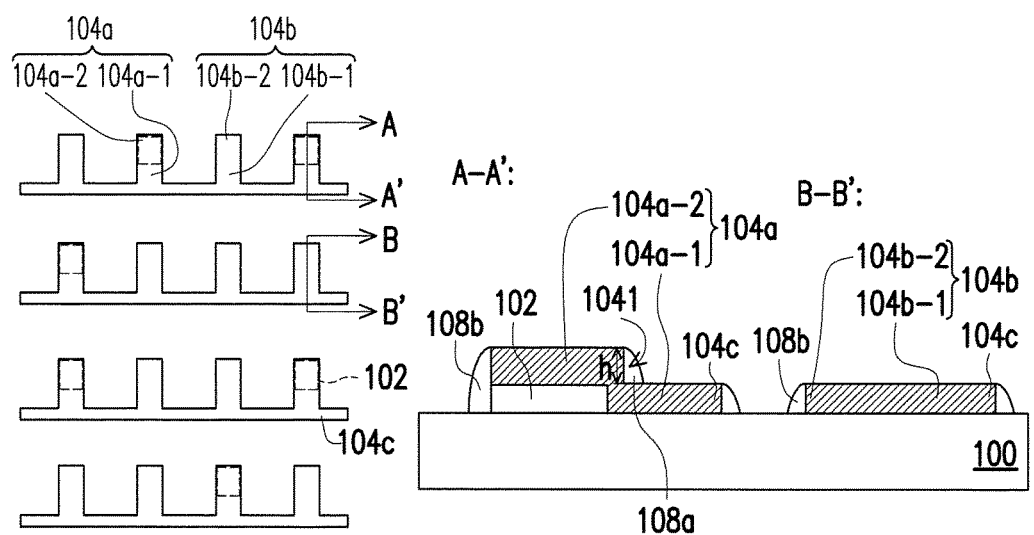
Figure 4:
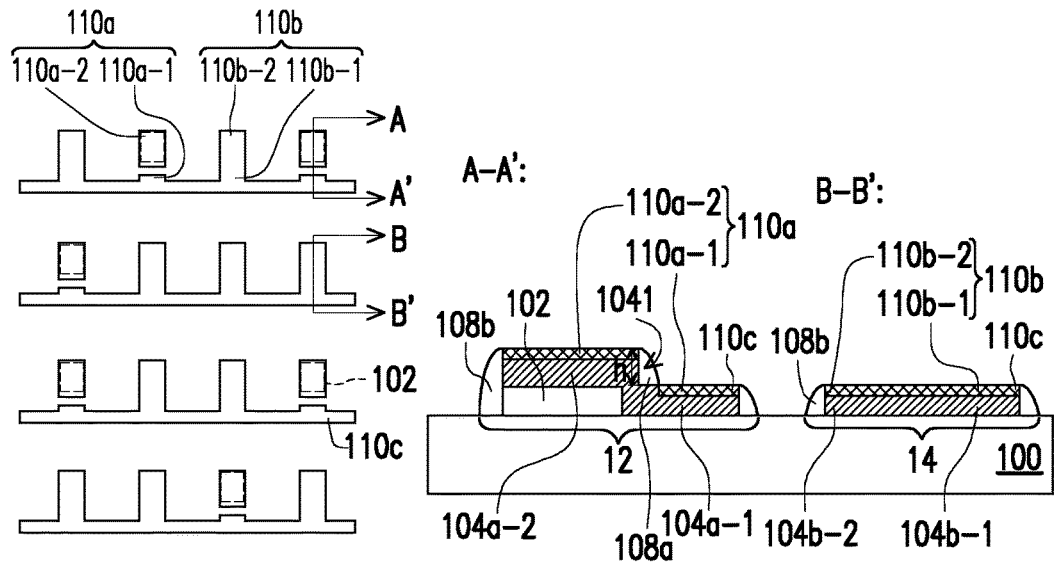
Figure 5:
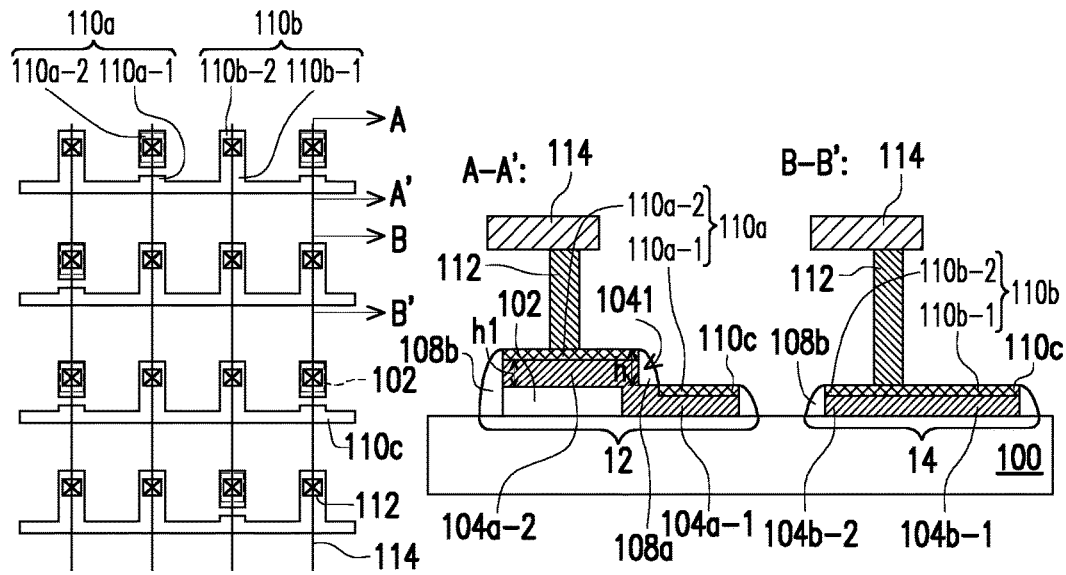

FIGS. 1 to 5 illustrate, in a top view as well as a cross-sectional view, a process for fabricating a Mask ROM according to an embodiment of this invention, wherein FIG. 5 also illustrates the structure of the Mask ROM according to the embodiment.

Figure 1:
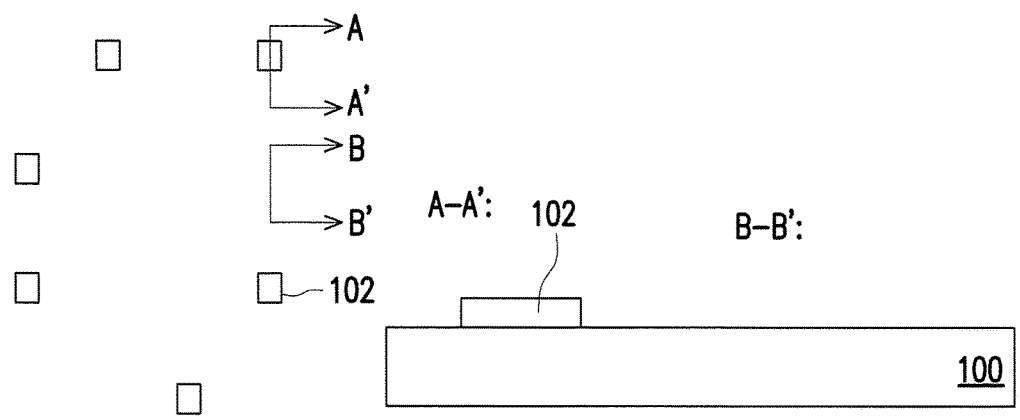
FIGS. 1 to 5 illustrate, in a top view as well as a cross-sectional view, a process for fabricating a Mask ROM according to an embodiment of this invention, wherein FIG. 5 also illustrates the structure of the Mask ROM according to the embodiment.

Referring to FIG. 1, a patterned material layer 102 is formed over a substrate 100, in order to cause the step structure of each first poly-Si layer in the subsequent process. The substrate 100 may include a field oxide (FOX) layer that is formed on a semiconductor substrate, or include a semiconductor substrate. The material layer 102 may include an insulating layer, for example. The insulating layer may include, for example, a pad oxide layer and an SiN layer on the pad oxide layer.

Figure 2:
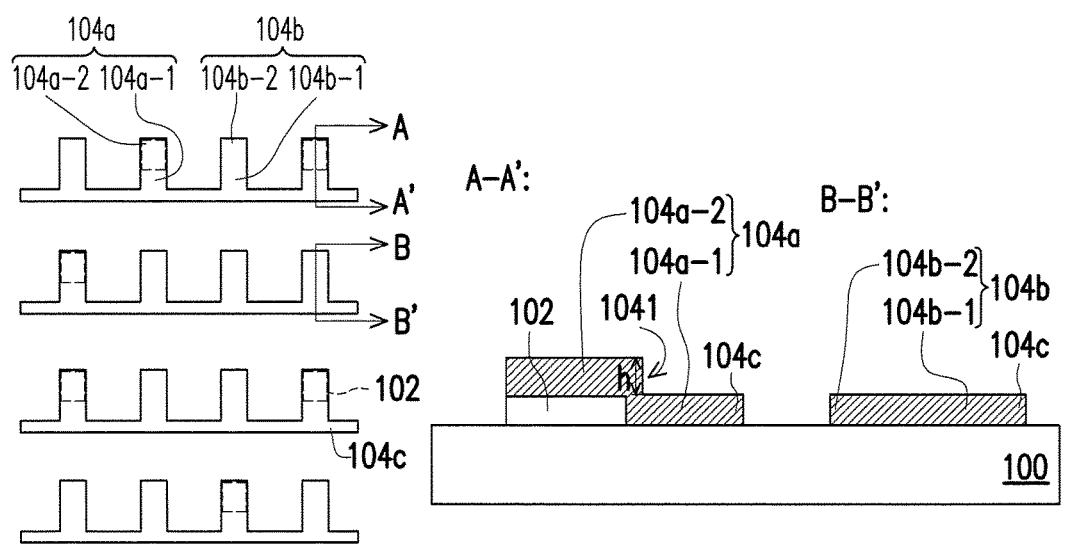
Figures 1, 2:
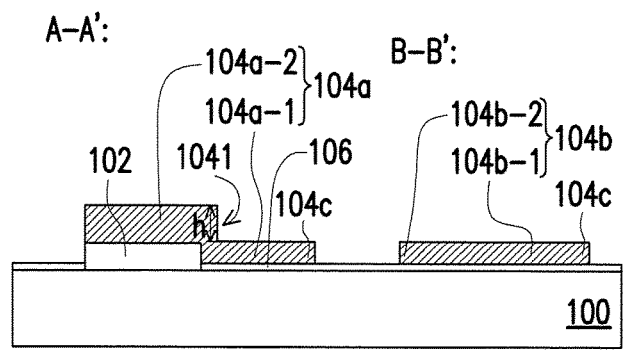

Referring to FIG. 2, a plurality of undoped first poly-Si layers 104a, a plurality of undoped second poly-Si layers 104b, and a plurality of undoped third poly-Si layers 104c for forming word lines later are formed over the substrate 100 and the material layer 102. Each first poly-Si layer 104a includes a lower horizontal bar 104a-1 that is connected with a third poly-Si layer 104c that is for forming a word line later, an upper horizontal bar 104a-2 on the material layer 102, and a step structure 1041 with a step height "h", due to presence of the material layer 102. The lower horizontal bar 104a-1 is contiguous with the upper horizontal bar 104a-2 at the step structure 1041, which belongs to a portion of both the bars 104a-2 and 104a-1 and is located at the contiguous region in the middle part of the bar 104a-2 and the bar 104a-1. The top surface of the lower horizontal bar 104a-1 is lower than that of the upper horizontal bar 104a-2 by the step height h and at the same height as the bottom surface of the upper bar 104a-2. Each second poly-Si layer 104b includes a first portion 104b-1 that is connected with a third poly-Si layer 104c that is for forming a word line later, and a second portion 104b-2.

The first poly-Si layers 104a, the second poly-Si layers 104b and the third poly-Si layers 104c are undoped and do not require doping because a silicide layer will be formed on each of them later for electrical connection. The step height h may range from 300 Å to 500 Å. In addition, the first poly-Si layers 104a, the second poly-Si layers 104b and the third poly-Si layers 104c may possibly be formed simultaneously with the poly-Si gate electrodes of logic devices (not shown).

When the substrate 100 includes include a semiconductor substrate, the first poly-Si layers 104a, the second poly-Si layers 104b and the third poly-Si layers 104c are preferably formed after an insulating layer 106 is formed over the substrate 100, as shown in FIG. 2-1. The insulating layer 106 may be formed simultaneously with the gate dielectric of logic devices (not shown).

Referring to FIG. 3, a spacer 108a is formed on the sidewall of the step structure 104l of each first poly-Si layer 104a, while spacers 108b are formed on the other sidewalls that are present on the substrate 100. The spacer 108a is directly contacting on a sidewall of the upper horizontal bar 104a-2 and a portion of the top surface of the lower horizontal bar 104a-1. One of the spacers 108b is the spacer on the sidewall of the lower horizontal bar 104a-1.

Referring to FIGS. 3 & 4, a salicide (self-aligned silicide) process is performed to form a first silicide layer 110a on each first poly-Si layer 104a, a second silicide layer 110b on each second poly-Si layer 104b, and a third silicide layer 110c on each third poly-Si layer 104c. The first silicide layer 110a is divided apart by the spacer 108a to be non-contiguous on the first poly-Si layer 104a. The second silicide layer 110b is contiguous on the second poly-Si layer 104b.

Each third silicide layer 110c and the underlying third poly-Si layer 104c serve as a word line. Each first silicide layer 110a includes a first portion 110a-1 that is on the lower horizontal bar 104a-1 of a first poly-Si layer 104a and is connected with a word line 110c, and a second portion 110a-2 that is on the upper horizontal bar 104a-2 of the first poly-Si layer 104a and is disconnected from the first portion 110a-1 due to presence of the spacer 108a. Each second silicide layer 110b includes a first portion 110b-1 that is connected with a word line 110c, and a second portion 110b-2 that is connected with the first portion 110b-1. Thereby, a plurality of first resistors 12 each based on a non-contiguous silicide layer 110a, and a plurality of second resistors 14 each based on a contiguous silicide layer 110b are made, serving as a first part of memory cells that represent "1" (or "0") and a second part of memory cells that represent "0" (or "1"), respectively.

Referring to FIG. 5, a plurality of contact plugs 112 are formed on the second portions 110a-2 of the first silicide layers 110a on the upper horizontal bars 104a-2 of the first poly-Si layers 104a, and on the second portions 110b-2 of the second silicide layers 110b. A plurality of bit lines 114 are formed, each being connected with the contact plugs 112 of a column of resistors 12/14. The height or thickness h1 of each upper horizontal bars 104a-2 is slightly smaller than the step height h between the top surfaces of the upper and lower bars 104a-2 and 104a-1 by the thickness of the first silicide layer 110a.

For a first resistor 12 that is based on a non-contiguous silicide layer 110a, because the corresponding word line 110c and the corresponding bit line 114 are connected with disconnected portions 110a-1 and 110a-2 of the non-contiguous silicide layer 110a, respectively, a current cannot flow between the corresponding word line 110c and the corresponding bit line 114. On the contrary, for a second resistor 14 that is based on a contiguous silicide layer 110b, because the corresponding word line 110c and the corresponding bit line 114 are connected with connected portions 110b-1 and 110b-2 of the contiguous silicide layer 110b, respectively, a current can flow between the corresponding word line 110c and the corresponding bit line 114. Thus, it is possible that each first resistor 12 represents "1" and each second resistor 14 represents "0", or each first resistor 12 represents "0" and each second resistor 14 represents "1".

Since resistors are utilized as memory cells and the bit-line contact plugs are formed on the resistors in the Mask ROM of this invention, current leakage can be prevented even if a contact plug is misaligned.

Moreover, the lateral area occupied by a resistor is remarkably smaller than the lateral area occupied by a MOS transistor in a conventional Mask ROM.

This invention has been disclosed above in the embodiments, but is not limited to those. It is known to people of ordinary skill in the art that some modifications and innovations may be made without departing from the spirit and scope of this invention. Hence, the scope of this invention should be defined by the following claims.

What is claimed is:

1. A Mask ROM, comprising:
a plurality of first resistors as a first part of memory cells, each of which includes:
an undoped first poly-Si layer including: an upper horizontal bar, a step structure with a step height, and a lower horizontal bar that is contiguous with the upper horizontal bar at the step structure and has a top surface being lower than a top surface of the upper horizontal bar by the step height and at same height as a bottom surface of the upper horizontal bar, wherein the step structure belongs to a portion of both the upper horizontal bar and the lower horizontal bar,
a spacer directly contacting on a sidewall of the upper horizontal bar and a portion of the top surface of the lower horizontal bar, and
a first silicide layer on the undoped first poly-Si layer, wherein the first silicide layer is divided apart by the spacer to be non-contiguous, and a height of the upper horizontal bar is smaller than the step height by a thickness of the first silicide layer;
a plurality of second resistors as a second part of the memory cells, each of which includes an undoped second poly-Si layer and a contiguous second silicide layer on the undoped second poly-Si layer; and
a plurality of contact plugs, disposed on the first silicide layer on the upper horizontal bar of each undoped first poly-Si layer, and on the second silicide layer.

2. The Mask ROM of claim 1, wherein each first resistor further includes a material layer that is under the upper horizontal bar of the undoped first poly-Si layer and causes the step height.

3. The Mask ROM of claim 2, wherein the material layer comprises an insulating layer.

4. The Mask ROM of claim 3, wherein the insulating layer comprises a pad oxide layer and an SiN layer on the pad oxide layer.

5. The Mask ROM of claim 1, wherein first portions of the second silicide layer and the first silicide layer on the lower horizontal bars of the undoped first poly-Si layers are connected with a plurality of word lines, and second portions of the second silicide layer and the first silicide layer on the upper horizontal bars of the undoped first poly-Si layers are connected with a plurality of bit lines.

6. The Mask ROM of claim 1, wherein the first resistors and the second resistors are disposed on a field oxide (FOX) layer.

7. The Mask ROM of claim 1, wherein the first resistors and the second resistors are disposed on a semiconductor substrate and separated from the semiconductor substrate by an insulating layer.

8. The Mask ROM of claim 7, wherein the insulating layer is formed simultaneously with gate dielectric of logic devices.

9. The Mask ROM of claim 1, wherein the undoped first poly-Si layers and the undoped second poly-Si layers are formed simultaneously with poly-Si gate electrodes of logic devices.

10. The Mask ROM of claim 1, wherein the step height ranges from 300 Å to 500 Å.

11. A Mask ROM, comprising:
- a plurality of first resistors as a first part of memory cells, each of which includes:
  - an undoped first poly-Si layer including: an upper horizontal bar, a step structure with a step height, and a lower horizontal bar that is contiguous with the upper horizontal bar at the step structure and has a top surface being lower than a top surface of the upper horizontal bar by the step height and at same height as a bottom surface of the upper horizontal bar, wherein the step structure belongs to a portion of both the upper horizontal bar and the lower horizontal bar,
  - a first spacer directly contacting on a sidewall of the upper horizontal bar and a portion of the top surface of the lower horizontal bar, and a second spacer on a sidewall of the lower horizontal bar, and
  - a first silicide layer on the upper horizontal bar and the lower horizontal bar of the undoped first poly-Si layer, wherein the first silicide layer is divided apart by the first spacer to be non-contiguous, and a height of the upper horizontal bar is smaller than the step height by a thickness of the first silicide layer;
- a plurality of second resistors as a second part of the memory cells, each of which includes an undoped second poly-Si layer and a contiguous second silicide layer on the undoped second poly-Si layer; and
- a plurality of contact plugs, disposed on the first silicide layer on the upper horizontal bar of each undoped first poly-Si layer, and on the second silicide layer.

\* \* \* \* \*